United States Patent
Cooper et al.

(10) Patent No.: US 10,651,045 B2
(45) Date of Patent: May 12, 2020

(54) COMPOSITIONS AND METHODS FOR ETCHING SILICON NITRIDE-CONTAINING SUBSTRATES

(71) Applicant: Entegris, Inc., Billerica, MA (US)

(72) Inventors: Emanuel Cooper, Scarsdale, NY (US); Steven Bilodeau, Oxford, CT (US); Wen-Haw Dai, Hsinchu County (TW); Min-Chieh Yang, Hsinchu County (TW); Sheng-Hung Tu, Hsinchu (TW); Hsing-Chen Wu, Yonghe (TW); Sean Kim, Gyeonggi-do (KR); SeongJin Hong, Cheongju-si (KR)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 16/122,940

(22) Filed: Sep. 6, 2018

(65) Prior Publication Data

US 2019/0074188 A1 Mar. 7, 2019

Related U.S. Application Data

(60) Provisional application No. 62/554,772, filed on Sep. 6, 2017.

(51) Int. Cl.
| | |
|---|---|
| *H01L 21/311* | (2006.01) |
| *C09K 13/08* | (2006.01) |
| *H01L 21/02* | (2006.01) |
| *H01L 21/67* | (2006.01) |
| *H01L 21/306* | (2006.01) |
| *C30B 33/10* | (2006.01) |

(52) U.S. Cl.
CPC ........ *H01L 21/31111* (2013.01); *C09K 13/08* (2013.01); *C30B 33/10* (2013.01); *H01L 21/0214* (2013.01); *H01L 21/02458* (2013.01); *H01L 21/30604* (2013.01); *H01L 21/67057* (2013.01); *H01L 21/67075* (2013.01); *H01L 21/67086* (2013.01)

(58) Field of Classification Search
CPC ......... H01L 21/31111; H01L 21/67086; H01L 21/67075; H01L 21/0214; H01L 21/02458; H01L 21/30604; H01L 21/67057; C30B 33/10; C09K 13/08
See application file for complete search history.

(56) References Cited

U.S. PATENT DOCUMENTS

| | | | |
|---|---|---|---|
| 6,162,370 A | 12/2000 | Hackett et al. | |
| 8,940,182 B2 | 1/2015 | Hong et al. | |
| 2007/0087580 A1* | 4/2007 | Kang | H01L 21/02079 438/778 |
| 2007/0235684 A1 | 10/2007 | Mistkawi et al. | |
| 2010/0176082 A1* | 7/2010 | Cooper | C09K 13/08 216/13 |
| 2013/0092872 A1 | 4/2013 | Hong et al. | |
| 2014/0190592 A1* | 7/2014 | Uchikawa | C23C 22/34 148/279 |
| 2016/0126107 A1 | 5/2016 | Kil et al. | |

FOREIGN PATENT DOCUMENTS

| | | |
|---|---|---|
| EP | 0498458 A2 | 8/1992 |
| TW | 201432809 A | 8/2014 |
| WO | 2007062046 A2 | 5/2007 |

* cited by examiner

*Primary Examiner* — Duy Vu N Deo
(74) *Attorney, Agent, or Firm* — Entegris, Inc.

(57) ABSTRACT

Described are compositions and methods useful for wet-etching a microelectronic device substrate that includes silicon nitride; the compositions including phosphoric acid, hexafluorosilicic acid, and an amino alkoxy silane, and optionally one or more additional optional ingredients; a wet etching method of a substrate that includes silicon nitride and silicon oxide, that uses a composition as described, can achieve useful or improved silicon nitride etch rate, useful or improved silicon nitride selectivity, a combination of these, and optionally a reduction in particles present at a substrate surface after etching.

20 Claims, 1 Drawing Sheet

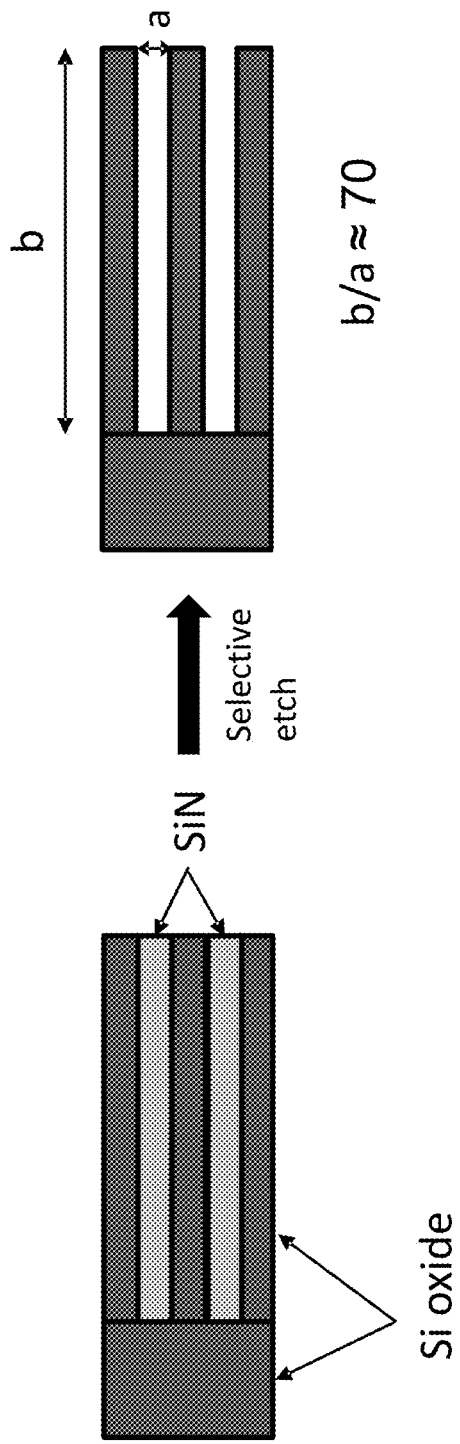

COMPOSITIONS AND METHODS FOR ETCHING SILICON NITRIDE-CONTAINING SUBSTRATES

CROSS-REFERENCE TO RELATED APPLICATIONS

This application claims the benefit under 35 USC 119 of U.S. Provisional Patent Application No. 62/554,772, filed Sep. 6, 2017, the disclosure of which is hereby incorporated herein by reference in its entirety for all purposes.

FIELD

The described invention relates to compositions and processes for etching silicon nitride in the presence of silicon oxide, including compositions and processes for effectively and efficiently etching silicon nitride material at a useful or advantageously high etch rate and with useful or advantageously high selectivity of silicon nitride with respect to exposed or underlying layers of silicon oxide, particularly in a multilayer semiconductor wafer structure.

BACKGROUND

In the microelectronics industry, ongoing demand exists for improved device performance and for decreased device sizes and decreased device feature sizes. Reduced feature sizes provide dual advantages of increasing device feature density and increasing device speed.

Reducing feature and device sizes requires finding new ways to improve steps of the multi-steps process of manufacturing microelectronic devices. In methods for preparing many types of microelectronic devices, a step of removing silicon nitride is common. A thin layer of silicon nitride ($Si_3N_4$), usually deposited by chemical vapor deposition from silane ($SiH_4$) and ammonia ($NH_3$), can be useful in a microelectronic device as a barrier for water and sodium. Also, patterned silicon nitride layers are used as a mask for spatially selective silicon oxide growth. After being applied, all or a portion of these silicon nitride materials may require removal, which is commonly performed by etching.

The removal of silicon nitride from a substrate by etching can preferably be performed in a manner that does not damage or disrupt other exposed or covered features of a microelectronic device. Often, a process of removing silicon nitride is performed in a manner that preferentially removes the silicon nitride relative to other materials that are also present at a surface of a microelectronic device substrate, such as silicon oxide. According to various commercial methods, silicon nitride is removed from a microelectronic device surface by a wet etching process that involves exposing the substrate surface to concentrated phosphoric acid ($H_3PO_4$) at an elevated temperature, e.g., in a bath having a temperature in a range from 150° C. to 180° C. Conventional wet etching techniques for selectively removing silicon nitride relative to silicon oxide have used aqueous phosphoric acid ($H_3PO_4$) solutions, typically about 85 weight percent phosphoric acid and 15 weight percent water. Using fresh hot phosphoric acid, a typical $Si_3N_4$:$SiO_2$ selectivity can be about 40:1.

SUMMARY

The present invention relates to novel and inventive etching compositions and related processes for removing silicon nitride from a surface of a microelectronic device substrate by wet etching methods. In example methods, an etching composition is used to remove silicon nitride from a surface that includes silicon nitride and silicon oxide as well as other optional conductive, insulative, or semiconductive materials, or a processing material that is useful during fabrication of the microelectronic device.

In the past, the integrated circuit and semiconductor fabrication industries have used hot phosphoric acid as an etching composition for etching silicon nitride. Additives such as dissolved silica have sometimes been included to improve performance. See, e.g., U.S. Pat. Nos. 6,162,370 and 8,940,182, the contents of which are incorporated herein by reference. However, while these hot phosphoric acid compositions have been commercially useful, improvements in etch rate of silicon nitride, and of selectivity for etching silicon nitride relative to other materials (e.g., silicon oxide), are still desired. As a different measure of performance, the substrate, after etching, should include an acceptably low level of solid particles at its surface, such as solid silica particles that may be generated (e.g., precipitated) in the etching composition during an etching step and re-deposited onto the substrate surface as a particle; improved etching compositions are desired that result in fewer of these types of solid particles being produced and deposited on a substrate surface during an etching step.

According to Applicant's invention, an etching composition can include a combination of phosphoric acid, hexafluorosilicic acid, and an alkylamine alkoxy silane. The composition may also include an amount of water, e.g., as is present in the phosphoric acid or another ingredients, or that can be added as a separate ingredient. A composition may also optionally include one or more of: a carboxylic acid compound; dissolved silica, which may be provided, for example, by dissolving silica in the phosphoric acid or by dissolving a soluble silicon-containing compound; an organic solvent; a surfactant; and an aminoalkyl compound. The described etching compositions can provide desirable or advantageous performance properties when used in a wet etching step to remove silicon nitride from a substrate that contains silicon nitride and silicon oxide materials such as: a useful or high silicon nitride etch rate, a useful or high selectivity of silicon nitride relative to silicon oxide, a balance of a useful or advantageously high etch rate with a useful or advantageously high silicon nitride selectivity, and the presence of fewer solid particles on a substrate surface following an etching step.

When used in a method of etching a microelectronic device substrate that contains silicon nitride and silicon oxide features at a surface, the inventive etching compositions can exhibit desired, useful, or advantageous performance relative to the use of a prior art or comparable etching composition in the same method with the same substrate. One example of a comparable etching composition is concentrated phosphoric acid (e.g., 85 percent by weight aqueous phosphoric acid) that includes dissolved silica or a soluble silica compound, the presence of which increases selectivity of etching silicon nitride. Examples of this type of comparable etching composition are described in U.S. Pat. No. 6,162,370, the entirety of which is incorporated herein by reference.

An improved performance of an inventive etching composition relative to a prior art etching composition or a comparable composition can be measured as one or more of: improved selectivity of etching silicon nitride relative to silicon oxide; improved etch rate of silicon nitride (relative to an etch rate of silicon nitride performed using an identical substrate and a different but comparable etching composition and etching process); or an improved combination of selectivity and etch rate. An absolute etch rate of silicon nitride depends greatly on its deposition method. As such, an "improved" silicon nitride etch rate as described herein is understood to refer to an improved (i.e., increased) etch rate of a silicon nitride material using a composition and etching process described herein, compared to an etch rate achieved by a process that uses a different but comparable etching composition and etching process, when processing the same type of silicon nitride material.

Commonly, within typical ranges, a relatively higher silicon nitride etch rate can occur in combination with a selectivity of silicon nitride relative to silicon oxide that is in a low end of a typical range; conversely, and a selectivity of silicon nitride relative to silicon oxide that is relatively higher can occur in combination with a relatively lower etch rate of silicon nitride. Compositions as presently described can achieve various levels and combinations of levels of silicon nitride etch rate and selectivity. According to some uses, a composition can achieve an advantageously high silicon nitride etch rate (e.g., improved relative to prior art or comparable etch rates) with a useful but not necessarily advantageously high selectivity of silicon nitride. According to other uses, a composition can achieve advantageously high silicon nitride selectivity with a useful but not necessarily an advantageously high silicon nitride etch rate.

An improved etch rate (as that term is used herein) can be one that is at least 25 percent greater than an etch rate of an identical silicon nitride material performed using a comparable or prior art etching composition and etching process. An improved selectivity can be one that is at least 50 percent greater than a comparable or prior art selectivity. A comparison of etch rates (or other performance of an etching process) should be based on experiments carried out on substrates that were produced by the same methods under the same conditions.

Etch rate and selectivity can be measured, for purposes of performance comparison, using etching solutions that have been used for processing wafers, to the same extent. As an example, etch rate and selectivity can be measured for purposes of comparing performances of two etching compositions at a beginning of an etching process, using etching compositions that are fresh and not previously used. Alternately, these measurements can be performed following a specific amount of processing of substrates using the etching compositions, such as after processing a number of wafers using the compositions. Performance (in terms of silicon nitride etch rate and selectivity) of an etching composition before it has been used for processing, compared to performance after an amount of processing, can be quite different, because dissolved silica is added to the solution as a product of silicon nitride dissolution, suppressing the oxide etch rate (also to a much lesser extent the nitride etch rate), and thus causing the selectivity to increase. A large increase in selectivity, however, can result in redeposition of silicon oxide as particles, or regrowth of oxide as film, in certain substrate areas. These phenomena are undesired and to be prevented.

In alternate terms, an etch composition or method of using the etch composition can be useful to achieve etch rate of silicon nitride, in combination with a selectivity of silicon nitride, within ranges that are generally suitable for commercial wet etching processes. Examples of useful etch rates that are typically used commercially (e.g., at an etching process temperature in a range from 150-160 degrees Celsius) may be at least 30 angstroms per minute, up to much higher rates of at least 400 or 500 angstroms per minute. Commercially suitable selectivities can also vary greatly, and may be in a range of from 20 or 50 100 (e.g., relative to silicon oxide), to as much as 500 or 1000.

Etch rate is a known performance measure of an etching process and can be reported in terms of an amount of material (e.g., in thickness) removed per time (e.g., angstroms of material per minute). Methods for determining etch rate of silicon nitride are well known in the microelectronic device fabrication industries. Generally, etch rate measurements are performed by etching a substrate that includes silicon nitride at a surface and measuring the amount of silicon nitride removed from the substrate over time. Any method of measuring an amount of material removed per a given time may be effective, with spectroscopic ellipsometry being one useful and preferred method for measuring silicon nitride (and silicon oxide) etch rate.

Selectivity is a known measure of performance of an etching process that performs etching of a surface having features of more than one material, and is calculated as a removal rate of one material (e.g., silicon nitride) relative to a removal rate of a second material (e.g., silicon oxide).

As another measure of performance, the substrate, subsequent to an etching step, preferably following a post-etch cleaning step (e.g., a thorough rinse in water at a temperature in a range from 20 to 90 degrees Celsius), should include an acceptably low level of solid particles at its surface. The solid particles may be particles of silica that are generated (e.g., precipitated) in the etching composition during an etching step and that become re-deposited onto the substrate surface as solid particles. On a silica substrate (e.g. thermal oxide, PETEOS) such redeposition can take the form of a thickening of the oxide film. Improved etching compositions are desired that result in fewer of these types of solid particles being produced and deposited on a substrate surface during an etching step.

Particle count on a surface of a substrate subsequent to an etch step can be measured by any method that is effective for statistically useful qualitative or quantitative comparison of the number of particles on a substrate surface subsequent to an etching step, such as after an etching step followed by a post-etch cleaning step. One example method can be optical (visual) inspection using magnification, such as with the assistance of a scanning electron microscope. An improved etching composition can allow for an etching step, optionally followed by a post-cleaning step, that produces a surface that includes a reduced number of particles as compared with an identical method performed on an identical substrate but using a comparable etching composition or a prior art etching composition. The reduction in particles present on the surface may be a reduction of at least 20, 30, or 50 percent compared to the number of particles present on a surface of an identical substrate processed using a comparable etching composition or a prior art etching composition. Furthermore, useful and preferred improved etching compositions of the present description are capable of producing a surface that does not include any more than an insubstantial amount of redeposited oxide, in particular, redeposited oxide that modifies local pattern geometry, e.g. by narrowing or blocking of channels, has to be avoided.

In one aspect, the invention relates to compositions for use in etching a substrate having a surface comprising silicon nitride (SiN) and silicon oxide, with selectivity for etching the SiN relative to the silicon oxide. The composition contains phosphoric acid, hexafluorosilicic acid (HFSA), and an amino alkoxy silane.

In another aspect, the invention relates to a method of etching a substrate having a surface comprising silicon nitride (SiN) and silicon oxide, with selectivity for etching the SiN relative to the silicon oxide. The method includes providing an etching composition that contains: concentrated phosphoric acid, hexafluorosilicic acid (HSFA), and an amino alkoxy silane; providing a substrate having a surface that includes silicon nitride and silicon oxide; and contacting the substrate with the composition at conditions to remove SiN from the surface.

BRIEF DESCRIPTION OF THE DRAWINGS

FIG. 1 shows schematically a structure of an exemplary substrate as described, before and after a selective etching step as also described.

DETAILED DESCRIPTION

The invention relates to novel and inventive wet etching compositions for etching a surface of a microelectronic device that contains silicon nitride (SiN), silicon oxide, and optionally other materials that may include a conductive material, a semiconducting material, or an insulating material useful in a microelectronic device, or a processing material that is useful in preparing a microelectronic device. An etching composition as described comprises phosphoric acid, hexafluorosilicic acid, an amino alkyl silane, and an amount of water that is associated with ingredients of the etching composition or added separately. A composition may also optionally include one or more of: a carboxylic acid compound; dissolved silica, which may be provided, for example, by dissolving silica in the phosphoric acid or by adding a soluble silicon-containing compound; an organic solvent; and an aminoalkyl compound.

The invention also relates to methods, processes, and systems that use a wet etching composition as described for etching a microelectronic device substrate to remove silicon nitride. The Applicant has discovered that when used in a wet etching process with a substrate that contains silicon nitride and silicon oxide, the described compositions can produce a useful or an advantageously high etch rate of silicon nitride, a useful or an advantageously high selectivity of silicon nitride relative to silicon oxide, or a useful or advantageous balance of these performance properties. Additionally, when used in a wet etching process with a substrate that contains silicon nitride, example etching compositions can result in effective etching of silica nitride with a reduced amount of particles being present at the substrate surface following etching.

As used herein, the term "microelectronic device" (or "microelectronic device substrate," or simply "substrate") is used in a manner that is consistent with the generally understood meaning of this term in the electronics, microelectronics, and semiconductor fabrication arts, for example to refer to any of a variety of different types of: semiconductor substrates; integrated circuits; solid state memory devices; hard memory disks; read, write, and read-write heads and mechanical or electronic components thereof; flat panel displays; phase change memory devices; solar panels and other products that include one or more solar cell devices; photovoltaics; and microelectromechanical systems (MEMS) manufactured for use in microelectronic, integrated circuit, energy collection, or computer chip applications. It is to be understood that the term "microelectronic device" can refer to any in-process microelectronic device or microelectronic device substrate that contains or is being prepared to contain functional electronic (electrical-current-carrying) structures, functional semiconductor structures, and insulating structures, for eventual electronic used in a microelectronic device or microelectronic assembly.

As used herein, the term "silicon nitride" is given a meaning that is consistent with the meaning of the term as used in the microelectronics and semiconductor fabrication industries. Consistent therewith, silicon nitride refers to materials including thin films made of amorphous silicon nitride ($Si_3N_4$), e.g., deposited by chemical vapor deposition from silane ($SiH_4$) and ammonia ($NH_3$), with commercially useful low levels of other materials or impurities. The silicon nitride may be present as part of a microelectronic device substrate as a functioning feature of the device, for example as a barrier layer or an insulating layer, or may be present to function as a material that facilitates a multi-step fabrication method for preparing a microelectronic device.

As used herein, the term "silicon oxide" is given a meaning that is consistent with the meaning of the term as used in the microelectronics and semiconductor fabrication industries. Consistent therewith, silicon oxide refers to thin films made of silicon oxide ($SiO_x$), e.g., $SiO_2$, "thermal oxide" ($ThO_x$), and the like. The silicon oxide can be placed on the substrate by any method, such as by being deposited by chemical vapor deposition from TEOS or another source, or by being thermally deposited. The silicon oxide can preferably contain a commercially useful low level of other materials or impurities. The silicon oxide may be present as part of a microelectronic device substrate as a feature of the microelectronic device, for example as an insulating layer.

Examples of certain presently preferred etching compositions include compositions in the form of aqueous solutions that contain, consist essentially of, or consist of: aqueous phosphoric acid (e.g., concentrated phosphoric acid and an optional an amount of added water) with hexafluorosilicic acid in amounts that are effective to produce desired etching (including a useful or advantageous etch rate) of silicon nitride; an amino alkyl silane in an amount effective to improve etch rate of silicon nitride or selectivity of silicon nitride relative to silicon oxide; optionally a carboxylic acid compound; optionally phosphonic acid; optionally an aminoalkyl compound; optionally a surfactant; optionally an organic solvent, optionally water, and optionally dissolved silica. These and other example compositions can comprise, consist of, or consist essentially of the recited ingredients and optional ingredients. As a general convention throughout the present description a composition of matter such as an etching composition as described, or an ingredient or component thereof, that is said to "consist essentially of" a group of specified ingredients or materials refers to a composition that contains the specified ingredients or materials with not more than a low or insignificant amount of other ingredients or materials, e.g., not more than 5, 2, 1, 0.5, 0.1, or 0.05 parts by weight of other ingredients or materials. For example, an etching composition that contains materials that consist essentially of: aqueous phosphoric acid, hexafluorosilicic acid, an amino alkyl silane, and optional ingredients as described, means an etching composition that contains these ingredients and not more than 5, 2, 1, 0.5, 0.1, or 0.05 parts by weight of any other dissolved or un-dissolved material or materials (individually or as a total) other than the identified materials.

The etching composition includes aqueous phosphoric acid (e.g., concentrated phosphoric acid) in an amount that is effective to produce desired etching of silicon nitride. The term "aqueous phosphoric acid" refers to an ingredient of the etching composition that is mixed or combined with other ingredients of the etching composition to form the etching composition. The term "phosphoric acid solids"

refers to the non-aqueous component of an aqueous phosphoric acid ingredient, or of an etching composition that is prepared from aqueous phosphoric acid ingredient.

The amount of phosphoric acid solids contained in an etching composition can be an amount that, in combination with the other materials of an etching composition, will provide desired etching performance, including desired silicon nitride etch rate and selectivity, which typically requires a relatively high amount (concentration) of phosphoric acid solids. For example, an etching composition can contain an amount of phosphoric acid solids that is at least about 50 weight percent based on total weight of the etching composition, e.g., at least 70, or at least about 80 or 85 weight percent phosphoric acid solids based on total weight of the etching composition.

To provide a desired amount of phosphoric acid solids, the composition may contain "concentrated" phosphoric acid as an ingredient that is mixed or combined with other ingredients (one ingredient optionally being water, in some form) to produce the etching composition. "Concentrated" phosphoric acid refers to an aqueous phosphoric acid ingredient that contains a high or maximum amount of phosphoric acid solids in the presence of a low or minimum amount of water and substantially no other ingredients (e.g., less than 0.5 or 0.1 weight percent of any non-water or non-phosphoric acid solids materials). Concentrated phosphoric acid can typically be considered to have at least about 80 or 85 weight percent phosphoric acid solids in about 15 or 20 weight percent water. Alternately, the etching composition may be considered to include an amount of concentrated phosphoric acid that is diluted with water, meaning for example concentrated phosphoric acid that has been diluted with an amount of water before or after being combined with other ingredients of the etching composition, or an equivalent formed in any manner. As another alternative, an ingredient of the etching composition can be concentrated phosphoric acid or a diluted phosphoric acid, and the etching composition can contain an additional amount of water that is provided to the etching composition either as a component of a different ingredient or as a separate water ingredient.

As an example, if concentrated phosphoric acid is used to form the etching composition, the amount of concentrated phosphoric acid (85 weight percent, in water) can be an amount that is at least 60, e.g., at least 80 or at least 90, 93, 95, or at least 98 weight percent of the etching composition, based on total weight etching composition.

As used herein, "hexafluorosilicic acid" (also referred to as "fluorosilicic acid" or "HFSA") refers to $H_2SiF_6$. Hexafluorosilicic acid is a known and commercially available material and is commonly sold or used as an ingredient in the form of a diluted solution, e.g., 35 percent by weight in water. HFSA can also be formed in situ from hydrofluoric acid (HF) and dissolved or suspended silica.

The amount of hexafluorosilicic acid compound (or a derivative compound thereof present) contained in an etching composition can be an amount that, in combination with the other materials of an etching composition, will provide desired etching performance, including desired silicon nitride etch rate and selectivity. For example, an etching composition can contain an amount of hexafluorosilicic acid compound in a range from about 5 to 10,000 or even up to 50,000 parts per million (i.e., from 0.0005 to 1 or even 5 weight percent) based on total weight of the etching composition, such as from about 20 to 2,000 parts per million (i.e., from 0.002 to 0.2 weight percent) based on total weight of the etching composition.

The etching composition contains an aminoalkyl alkoxy silane, or "amino alkoxy silane" for short, which, as these terms are used herein, refers to a silane (—SiO—)-based compound or molecule that contains at least one silicon atom and at least one amine group located on an alkyl or an alkoxy substituent of the compound, i.e., an aminoalkyl substituent connected to the silicon atom either directly or through an oxygen linkage. The silicon atom can be substituted with one or more such aminoalkyl substituents, and can be substituted additionally with one or more: hydroxide (—OH) group, organic chemical (e.g., alkyl) groups, or another silicon atom through an oxygen to form a siloxane linkage, i.e., to form a molecule having multiple (e.g., 2, 3, 4, etc.) —Si—O— linkages; according to the present description, the aminoalkyl alkoxy silane compound includes substituents as described, with at least one substituent of a silicon atom being an aminoalkyl substituent bonded directly to the silicon atom or bonded to the silicon atom through a divalent oxygen (—O—) linkage, e.g., an aminoalkyl or aminoalkoxy substituent. Example compounds are shown in U.S. Pat. No. 8,940,182. See also European Patent Application 0 498 458.

Certain preferred amino alkoxy silane compounds that contain only a single silicon atom can be represented as having the following formula:

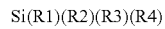

Si(R1)(R2)(R3)(R4)

wherein each of R1, R2, R3, and R4 is an alkyl group, alkoxy group, hydroxyl group, an alkylamine group, or an alkoxyamine (aminoalkoxy) group, and wherein at least one of R1, R2, R3, and R4 is an alkyl, alkoxy, or hydroxyl group, and at least one of R1, R2, R3, and R4 is an alkylamine group or alkoxyamine group. An R1, R2, R3, or R4 group that includes an alkyl chain may include an alkyl that is branched, but straight chain groups can be preferred, as well as chains that contain lower alkyl groups such as an alkyl group having 1, 2, 3, 4, or 5 carbon atoms. Preferred R1, R2, R3, and R4 groups are also non-cyclic, saturated, and do not contain ether linkages.

According to the invention, Applicant has found that the presence of an amino alkoxy silane compound as part of an etching composition that contains phosphoric acid in combination with hexafluorosilicic acid can exhibit improved performance as described herein, and that the presence of an amine functionality (e.g., as part of an alkylamine group or an alkoxyamine group) on the amino alkoxy silane compound (as opposed to an alkoxy silane compound that contains no amine functionality), can be especially effective in improving the performance properties. The amine-containing group can be any group that provides a desired improvement in etching performance, such as an improvement in one or a combination of silicon nitride etch rate, silicon nitride selectivity, or particle count at a surface of a substrate following an etch step. Some general examples of amine-containing groups of the amino alkoxy silane compounds include alkylamine groups that include a primary amine, i.e., a terminal amine; alkylamine groups that include a secondary or tertiary amine; and well as poly(ethyleneimine) oligomers and similar groups.

According to certain presently preferred amino alkoxy silane compounds, each of R1, R2, R3, and R4 is:

an alkylamine group having a formula —$(CH_2)_x NW_2$ wherein x is in a range from 1 to 12, or —$(CH_2)_{x1}$—NW—$(CH_2)_{x2}$—NW— . . . $(CH_2)_{xn}$—$NW_2$ where W equals H or a $CH_3$ group; x1, x2, . . . xn are in the range of 1-12 (preferably 2 or 3), and n≤100, an aminoalkoxy group having a formula —O—$(CH_2)_x$—$NW_2$ wherein x is in a range from 1 to 12, or —O—$(CH_2)_{x1}$—NW—$(CH_2)_{x2}$—NW— ... $(CH_2)_{xn}$—$NW_2$ where W equals H or a $CH_3$ group; x1, x2, ... xn are in the range of 1-12 (preferably 2 or 3), and n≤100, an alkoxy group having a formula —$O(CH_2)_yCH_3$ wherein y is in a range from 1 to 6, a hydroxyl group (silanol, —OH), or an alkyl group having a formula —$(CH_2)_zCH_3$ where z is in the range from 1 to 18.

While the R groups connected to the silicon atom through an oxygen atom will normally be at least partially solvolized, the amino alkoxy silane compound can preferably be otherwise chemically stable in the etching composition and not degraded by the phosphoric acid or another ingredient of the etching composition, and preferably does not cause significant coloration of the etching composition (though discoloration can be present). In use, when included in the phosphoric acid, the amine group will normally be protonated.

Examples of presently preferred amino alkoxy silane compounds include the following species: (3-aminopropyl)triethoxysilane (APTES, CAS no. 919-30-2); (3-aminopropyl)trimethoxysilane (APTMS, CAS no. 13922-56-5); (3-aminopropyl)silane triol (CAS no. 58160-99-9); and AHAPTES (N-(6-aminohexyl)aminopropyltrimethoxysilane, CAS no. 51895-58-0) any of which can be used alone, in combinations with each other, or in combination with another amino alkoxy silane.

The amount of amino alkoxy silane (or a derivative thereof) contained in an etching composition can be an amount that, in combination with the other materials of an etching composition, will provide desired etching performance, including desired silicon nitride etch rate and selectivity. For example, an etching composition can contain an amount of amino alkoxy silane compound, which may be a single species or a combination of two or more species, in a range from about 20 to 10,000 parts per million (i.e., from 0.0020 to 1.0 weight percent) based on total weight of the etching composition, or from about 20 to 2,000, 4,000, or 5,000 parts per million (i.e., from 0.002 to 0.2, 0.4, or 0.5 weight percent) based on total weight of the etching composition.

Optionally and preferably, example etching compositions can contain an amount of carboxylic acid compound, meaning an organic compound that contains at least one carboxylic acid group. According to the invention, the presence of a carboxylic acid compound in an etching composition as described can improve performance by inhibiting redeposition of silicon oxide or formation of particles of the same. Preferred carboxylic acid compounds for use in an etching composition as described include acetic acid, malonic acid, succinic acid, 2-methylsuccinic acid, glutaric acid, adipic acid, salicylic acid, 1,2,3-propanetricarboxylic acid (a.k.a. tricarballylic acid), 2-phosphonoacetic acid, 3-phosphonopropanoic acid, and 2-phosphonobutane-1,2,4-tricarboxylic acid (PBTCA), any of which may be used alone, in combination together with each other, or in combination with a different carboxylic acid compound.

The amount of carboxylic acid compound (including derivatives thereof) contained in an etching composition can be an amount that, in combination with the other materials of an etching composition, will provide desired etching performance while not otherwise affecting performance or chemical stability of an etching composition. For example, an etching composition can contain an amount of carboxylic acid compound, which may be a single species or a combination of two or more species, in a range from about 0.01 to about 10 weight percent based on total weight of the etching composition, or from about 0.1 to about 5 or 8 weight percent based on total weight of the etching composition.

Optionally, an etching composition as described (e.g., before use in an etching process) can also contain an amount of silica dissolved in the phosphoric acid, e.g., by dissolving solid silica material in the phosphoric acid or by adding a soluble silicon-containing compound that can form dissolved silica by reaction with aqueous phosphoric acid, examples of such compounds including TMAS (tetramethylammonium silicate), tetraacetoxysilane, or a tetraalkoxysilane such as tetramethoxysilane, tetraethoxysilane, or the like. The dissolved silica may be effective to improve selectivity of an etching composition toward silicon nitride. The amount may be any useful amount that does not lead to pre-processing silica supersaturation at conditions of an etching process, such as from about 5 to 10,000 parts per million dissolved silica or soluble silicon-containing compound based on total weight of the etching composition, or from about 20 to 5,000, 3,000, 1,000, or 500 parts per million based on total weight of the etching composition.

Also optionally, an etching composition as described can contain an amount of an alkylamine to increase performance of the etching composition such as by increasing silicon nitride etch rate, selectivity, or a combination of these. The alkylamine can be an organic alkyl compound that includes an amine substituent (e.g., a primary amine), e.g., of a formula $R5NH_2$, wherein R5 is a straight or branched, preferably saturated, preferably un-substituted alkyl chain that contains from about 2 to about 15 carbon atoms, e.g., from about 4 to about 12 carbon atoms. Examples of preferred alkylamine compounds include hexylamine, octylamine, 2-ethylhexylamine, dihexylamine, and decylamine. The alkylamine may be effective to provide improved etching rate or selectivity of silicon nitride, particularly when used in the presence of dissolved silica. The amount of the alkylamine in an etching composition may be any useful amount, such as from about 5 to 10,000 parts per million alkylamine, e.g., from about 20 to 1,000 parts per million alkylamine, based on total weight of the etching composition.

The etching composition can optionally include an organic (non-aqueous) solvent, which can be any organic compound that is liquid at relevant operating temperature (e.g., a temperature of an etching bath), and is substantially miscible in, compatible with, and stable in the presence of hot phosphoric acid of the etching composition. An organic solvent may be useful for an etching composition that does not require an etch rate that is in a high range of performance of an etching composition as described, and may be effective to reduce or minimize particulate re-deposition (e.g., silica particle re-deposition), during an etching process, to thereby reduce the presence of solid particles on a substrate surface after etching. Examples of useful or presently preferred non-aqueous solvent include organic compounds such as ethers, polyols, alcohols, sulfones, and phosphate esters. Specific examples of certain useful organic solvents include sulfolane, tetraethylene glycol dimethyl ether (tetraglyme), diethylene glycol ethyl ether, dipropylene glycol methyl ether, and triethyl phosphate, any of which may be used alone or in combination with one or more other organic solvent.

The amount of organic solvent in an etching composition can be an amount that, in combination with the other materials of an etching composition, will provide desired overall performance. For example, an etching composition can contain an amount of total organic solvent that may be in a range from about 0.1 to about 25 weight percent, e.g., from about 0.5 to about 10, 15, or 20 weight percent organic solvent based on total weight of the etch composition.

The etching composition can optionally include a surfactant (different from the other optional or required ingredients of the present description) to improve performance of the etching composition. As used herein the term "surfactant" refers to an organic compound that lowers the surface tension (or interfacial tension) between two liquids or between a liquid and a solid, typically an organic amphiphilic compound that contains a hydrophobic group (e.g., a hydrocarbon (e.g., alkyl) "tail") and a hydrophilic group. Preferred surfactants are thermally stable and stay ionic under strongly acidic conditions such as the conditions of an etching process of the present invention. Examples include perfluoroalkylsulfonic acids and long-chain quaternary ammonium compounds (e.g. dodecyltrimethylammonium hydrogen sulfate). Fluorinated non-ionic surfactants such as Chemours' Capstone® FS-31/FS-35 can also be used. Non-ionic unfluorinated surfactants such as poly(ethylene glycol)-poly(propylene glycol) copolymers ("PEG-PPG") can also be used, and are better suited for the lower-temperature, lower-acidity part of the operating range (e.g. 100-130 degrees Celsius and 50-75 percent $H_3PO_4$).

The amount of surfactant in an etching composition can be an amount that, in combination with the other materials of an etching composition, will provide desired overall performance. For example, an etching composition can contain an amount of surfactant that may be in a range from about 0.001 to about 10 weight percent, e.g., from about 0.01 to about 0.5, 1, 2, 7, or 7 weight percent surfactant based on total weight of the etching composition.

The etching composition can contain water from one or from multiple sources. For example, water will be present in an aqueous phosphoric acid ingredient. Additionally, water may be used as a carrier for one or more of the other ingredients of the etching composition, and water may be added alone as its own ingredient. The amount of water should be sufficiently low to allow the etching composition to exhibit desired or preferred or advantageous performance properties, including a useful (sufficiently high) silicon nitride etch rate. An increase in the presence of water tends to increase the etch rate of silicon nitride but can also depress the boiling point of the etching composition, which forces a reduction in operating temperature of the etching composition and an opposite effect. Examples of amounts of water, from all sources, in an etching composition, can be less than about 50, 40, or 30 weight percent, for example in a range from about 5 weight percent to about 25 percent by weight, based on total weight of the etching composition, or in a range from about 10 to 20 weight percent water based on total weight of the etching composition.

Optionally, these and other example etching compositions as described can contain, consist of, or consist essentially of the phosphoric acid, hexafluorosilicic acid, amino alkoxy silane, and any one or any combination of the identified optional ingredients. Certain preferred examples of etching compositions do not require and may exclude other types of ingredients not typically included in an etching composition, such as a pH adjusting agent (other than the acids mentioned as potential ingredients herein) and solid materials such as abrasive particles.

An etching composition as described, can be prepared by any method that will be useful to produce an etching composition as described. By one method, aqueous or solid ingredients can be combined, optionally with heat, any mixed to uniformity.

An etching composition as described can be useful for methods of removing silicon nitride from a surface of a microelectronic device substrate. The substrate can contain other materials that are useful in a microelectronic device, such as one or more of an insulator, barrier layer, conducting material, semiconducting material, or a material that is useful for processing a microelectronic device (e.g., photoresist, mask, among others). Example substrates have a surface that includes silicon nitride, thermal oxide (ThOx) and PETEOS (oxide deposited using plasma enhanced tetra ethyl ortho silicate).

In use, an etching composition as described can provide etching performance that is useful based on commercial performance needs and expectations, and, preferably, as compared to prior art or comparative etching compositions, can provide improved performance with respect to etch rate and selectivity of silicon nitride, and in terms of the amount of particles that are present at a surface of a substrate after etching, and the amount of regrowth of oxide film on a substrate surface.

Methods of etching microelectronic device substrates are known in the semiconductor fabrication arts, and can be performed on known and commercially available equipment. Generally, to etch a substrate to selectively remove a material at a surface of the substrate, etching composition can be applied to the surface and allowed to contact surface structures to selectively remove certain of the structures, chemically.

Silicon nitride films occasionally have a thin oxidized surface that can inhibit the etching process, since the composition is designed to etch oxide very slowly. In such cases, a very brief treatment with dilute HF can be a useful first process step.

In an etching step, the etching composition can be applied to the surface in any suitable manner, such as by spraying the etching composition onto the surface; by dipping (in a static or dynamic volume of the composition) the substrate into etching composition; by contacting the surface with another material, e.g., a pad, or fibrous sorbent applicator element, that has etching composition absorbed thereon; by contacting the substrate with an amount of the etching composition in a circulating pool; or by any other suitable means, manner or technique, by which the etching composition is brought into removal contact with the surface of the microelectronic substrate that contains silicon-germanium and silicon. The application may be in a batch or single wafer apparatus, for dynamic or static cleaning.

The conditions (e.g., time and temperature) of a useful etching process can be any that are found to be effective or advantageous. Generally, etching composition is contacted with the surface, such as by submersion in a bath of the etching composition, for a time that is sufficient to selectively remove silicon nitride. The time of exposure to the etching composition and the temperature of the etching composition can be effective for a desired amount of removal of the silicon nitride from a surface of the substrate. The amount of time for an etching step should not be too short, because this means that an etch rate of silicon nitride may be too high, which can lead to process control difficulties and reduced quality of a microelectronic device at the end of an etch step. Of course the amount of time required for an etch step is preferably not unduly long, to allow good efficiency and throughput of an etching process and semiconductor fabrication line. Examples of useful times for an etching step may be in a range from about 5 minutes to about 200 minutes, preferably about 10 minutes to about 60 minutes, at a temperature in a range of from about 100 degrees Celsius to about 180 degrees Celsius. Such contacting times and temperatures are illustrative, and any other suitable time and temperature conditions may be employed that are efficacious to achieve the required removal selectivity.

An etching step of the present description can be useful to etch silicon nitride material from a surface of any type of substrate. According to particular embodiments, a substrate can include alternating thin film layers of silicon nitride as structural features of a substrate that includes alternating thin film layers of the silicon nitride layers with silicon oxide. The silicon oxide layers are high aspect ratio structures that contain the silicon nitride layers disposed between the layers of silicon oxide. Referring to FIG. 1, a substrate is shown before and after a selective etch step as described herein that is effective to remove silicon nitride from a substrate in a selective manner, e.g., preferentially relative to silicon oxide. The substrate before the etch step includes the alternating layers of silicon nitride positioned in openings between high aspect ratio silicon oxide structures. The etch step removes the silicon nitride to leave behind the silicon oxide layers, as shown as the right-side substrate of FIG. 1, with openings or "slits" separating the silicon oxide layers. According to the present description, an etching process can be used as illustrated at FIG. 1 to etch a substrate shown at FIG. 1. Example etching processes can exhibit a significantly increased SiN etch rate, good selectivity relative to silicon oxide (>50, preferably close to or above 100), and avoidance of major silica redeposition (as evidenced by closure or near-closure of the slit openings), as compared to prior art and comparable etching compositions and etching processes.

After completion of a desired amount of selective etching of silicon nitride, etching composition that remains on a surface of an etched microelectronic device can be removed from the surface by any desired and useful method, such as by a rinse, wash, or other removal step, using water (or optionally phosphoric acid followed by water). For example, after etching, a microelectronic device substrate may be rinsed with a rinse of deionized water (e.g., at a temperature in a range from about 20 to about 90 degrees Celsius) followed by drying, e.g., spin-dry, N2, vapor-dry etc. Following the rinse the substrate surface may be measured for the presence and amount of particles at the surface.

Examples

Example etching compositions are described in the following table. Some ingredients, as indicated, were dissolved in concentrated phosphoric acid as a carrier before being combined with other ingredients of the composition. Performance results are also listed based on use of the etching compositions in a process of etching a substrate that includes silicon nitride at a surface.

| | | | | Formulation components in wt % | | | | | |
|---|---|---|---|---|---|---|---|---|---|
| | HFSA | APTES | surfactant | carboxylic acid-containing compound | NH$_4$Cl | 98% H$_2$SO$_4$ | SiO2 | alkyl-amine | 85% H$_3$PO$_4$ |
| 1 | 0.0175 | 0.03 | | | | | | | 99.9525 |
| 2 | 0.0175 | 0.03 | | 0.12 | | | | 0.02 | 99.8125 |
| 3 | 0.0175 | 0.03 | | 0.1 | | | | | 99.8525 |
| 4 | 0.0175 | 0.03 | | | 0.01 | | | | 99.9425 |
| 5 | 0.015 | 0.02 | | 2 | | | | | 97.965 |
| 6 | 0.015 | 0.02 | | 2 | | | 0.01 | | 97.955 |
| 7 | 0.015 | 0.02 | | 2 | | | | 0.02 | 97.945 |
| 8 | 0.015 | 0.02 | | 2 | | | 0.01 | 0.02 | 97.935 |
| 9 | 0.015 | | | 2 | | | | 0.02 | 97.965 |
| 10 | 0.015 | 0.02 | | | | | | 0.02 | 99.945 |
| 11 | 0.015 | 0.02 | | | | | | 0.01 | 99.955 |
| 12 | 0.015 | 0.02 | | | | | | 0.01 | 99.955 |
| 13 | 0.015 | 0.02 | | | | | | | 99.965 |
| 14 | 0.015 | 0.02 | 0.004 | | | | | | 99.961 |
| 15 | 0.015 | 0.0175 | | | | 0.25 | | | 99.7175 |
| 16 | 0.01 | 0.015 | | 1 | | | | | 98.975 |
| 17 | 0.01 | 0.0175 | | 1.5 | | | | | 98.4725 |
| 18 | 0.0116 | 0.02 | | 0.1 | | | | | 99.8684 |
| 19 | 0.015 | 0.0224 | | 1 | | | | | 98.9626 |
| 20 | 0.015 | 0.026 | | 0.11 | | | | | 99.849 |
| 21 | 0.015 | 0.0224 | | 1.1 | | | | | 98.8626 |
| 22 | 0.015 | 0.0224 | | 1.1 | | | | 0.02 | 98.8426 |
| 23 | 0.015 | 0.0224 | | 1.5 | | | | 0.03 | 98.4326 |
| 24 | 0.015 | 0.0224 | | 0.9 | | | | 0.025 | 99.0376 |
| 25 | 0.0137 | 0.0235 | | 0.15 | | | | 0.025 | 99.7878 |

Experimental results

| | Oxide gap % in 30 min (compared to 80 min 85% H$_3$PO$_4$) (A) | SiN etching % in 30 min (compared to 80 min 85% H$_3$PO$_4$) (B) | SiN etching % in 30 min (compared to 30 min 85% H$_3$PO$_4$) (C) | Oxide removal rate [Å/min] (D) | SiN etch rate [Å/min] (E) | Selectivity (F) |
|---|---|---|---|---|---|---|
| 1 | 48.3 | 92.2 | 246.0 | 0.65 | 56.31 | 86.6 |
| 2 | 34.5 | 93.2 | 248.5 | 0.60 | 57.5 | 95.8 |
| 3 | 55.2 | 91.3 | 243.4 | 0.69 | 56.91 | 82.5 |
| 4 | 13.8 | 97.1 | 258.9 | 0.35 | 59.9 | 171.1 |
| 5 | 69.0 | 80.6 | 214.9 | 0.72 | 53.91 | 74.9 |
| 6 | close | 79.6 | 212.3 | −1.49 | 49.12 | |
| 7 | 82.8 | 81.6 | 217.5 | 0.76 | 50.32 | 66.2 |
| 8 | 96.6 | 79.6 | 212.3 | 0.81 | 49.12 | 60.6 |
| 9 | close | 79.6 | 212.3 | −2.57 | 49.12 | |
| 10 | 27.6 | 78.6 | 209.7 | 0.58 | 48.52 | 83.7 |
| 11 | 13.8 | 72.8 | 194.2 | 0.49 | 44.93 | 91.7 |
| 12 | 13.8 | 79.6 | 212.3 | 0.53 | 49.12 | 92.7 |
| 13 | close | 97.1 | 258.9 | −0.36 | 59.90 | |
| 14 | 9.7 | 84.5 | 225.2 | 0.51 | 52.11 | 102.2 |
| 15 | close | 96.1 | 256.3 | −0.39 | 50.59 | |
| 16 | 82.8 | 76.7 | 204.5 | 0.77 | 47.32 | 61.5 |
| 17 | 82.8 | 63.1 | 168.3 | 0.33 | 38.94 | 118.0 |
| 18 | 82.8 | 70.9 | 189.0 | 0.76 | 43.73 | 57.5 |
| 19 | 82.8 | 80.6 | 214.9 | 0.78 | 49.72 | 63.7 |
| 20 | 34.5 | 82.5 | 220.1 | 0.58 | 50.32 | 86.8 |
| 21 | 55.2 | 77.7 | 207.1 | 0.70 | 49.71 | 71.0 |
| 22 | 34.5 | 87.4 | 233.0 | 0.60 | 53.91 | 89.9 |
| 23 | 27.6 | 88.3 | 235.6 | 0.53 | 54.51 | 102.8 |
| 24 | 34.5 | 87.4 | 233.0 | 0.60 | 53.91 | 89.9 |
| 25 | 69.0 | 89.3 | 238.2 | 0.72 | 55.11 | 76.5 |

In the tables:

1. A comparison of examples 13 and 5 shows performance differences due to the presence of a carboxylic acid compound.

2. Examples 6 and 8 show a positive effect of adding 200 ppm alkylamine when the solution is loaded with an additional 100 ppm SiO$_2$. This loading of SiO$_2$ can occur due to adding dissolved silica as an ingredient of the etching composition, or may occur upon use of the etching composition in an extended etching process as SiN dissolution adds oxide to the solution.

3. Examples 7 and 9 show a negative effect of omitting the APTES, even in the absence of silica loading and in the presence of the amine additive.

4. Example 14 shows the positive effect of an added surfactant in comparison to Example 13.

5. The results recorded in columns A, B, and C are from 30 minutes etching of slit patterns (see FIG. 1), which are compared (in A and B) to runs performed with fresh plain 85% H$_3$PO$_4$ run for 80 minutes. Column C shows that if a 30-min run using plain H$_3$PO$_4$ is compared with 30-min runs of an inventive composition, the SiN etch rate (as reflected by the depth of penetration into the slits) is typically about two times greater. (The results in column C were obtained by calculation—dividing the 80-min etch depth by 2.667. Results of 30-min runs of plain H$_3$PO$_4$ were not available.)

6. Columns D, E, and F show blanket film etch rates and the respective selectivities.

7. The results that include the term "close" at column A are for formulations where the 30 min runs resulted in closing of the slit openings (the "oxide gap" in column B). The same examples showed negative oxide etch rates on blanket films and selectivity (F) is not applicable. These data (a "close" result of column A) can be considered to relate to extreme performance requirements, and the relevant example formulations (6, 9, 13, and 15) may be effective for etching other substrates, patterns with smaller aspect ratio, or when using alternate etching conditions or process steps such as improved agitation.

What is claimed is:

1. A composition for use in etching a substrate having a surface comprising silicon nitride (SiN) and silicon oxide, with selectivity for etching the SiN relative to the silicon oxide, the etching composition comprising:
   concentrated phosphoric acid in an amount of at least 60 wt % based on the total weight of the etching composition,
   hexafluorosilicic acid (HFSA), and
   an amino alkoxy silane.

2. The composition of claim 1 comprising:
   from 5 to 50,000 parts per million (ppm) hexafluorosilicic acid (HFSA), and
   from 20 to 10,000 ppm amino alkoxy silane.

3. The composition of claim 1, wherein the amino alkoxy silane has the formula:

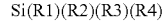

wherein each of R1, R2, R3, and R4 is an alkyl group, an alkylamine group, an alkoxy, or a hydroxyl group, at least one of R1, R2, R3, and R4 is an alkoxy or hydroxyl group, and at least one of R1, R2, R3, and R4 is an alkylamine group.

4. The composition of claim 3 wherein each of R1, R2, R3, and R4 is:
   an alkylamine group having a formula:
   —(CH$_2$)$_x$NW$_2$ wherein x is in a range from 1 to 12, or
   —(CH$_2$)$_{x1}$—NW—(CH$_2$)$_{x2}$—NW— . . . (CH$_2$)$_{xn}$—NW$_2$ wherein W equals H or a CH$_3$ group; x1, x2, . . . xn are in the range of 1-12, and n≤100,
   an alkoxy group having a formula —O(CH$_2$)$_y$CH$_3$ wherein y is in a range from 1 to 6,
   a hydroxyl group, or an alkyl group having a formula —(CH$_2$)$_z$CH$_3$ where z is in the range from 1 to 18.

5. The composition of claim 1, wherein the amino alkoxy silane is (3-aminopropyl)triethoxysilane (APTES), (3-aminopropyl)trimethoxysilane (APTMSAS), (3-aminopropyl)silane triol, [N-(6-aminohexyl)aminopropyltrimethoxysilane, (AHAPTES), or a combination thereof.

6. The composition of claim 1 further comprising a carboxylic acid compound.

7. The composition of claim 6, wherein the carboxylic acid is acetic acid, glutaric acid, or a combination thereof.

8. The composition of claim 6 comprising from 0.01 to 10 weight percent carboxylic acid compound based on total weight composition.

9. The composition of claim 1, further comprising an alkylamine compound.

10. The composition of claim 9, wherein the alkylamine compound is a primary alkylamine.

11. The composition of claim 9, wherein the alkylamine compound is octylamine, decylamine, or a combination thereof.

12. The composition of claim 9 comprising from 5 to 10,000 ppm alkylamine compound.

13. The composition of claim 1 further comprising dissolved silica or a soluble silicon-containing compound.

14. The composition of claim 13 comprising from about 5 to 10,000 parts per million dissolved silica or soluble silicon-containing compound based on total weight of the composition.

15. The composition of claim 1 further comprising not more than 50 percent water by weight, including water from all sources.

16. The composition of claim 1 further comprising an organic solvent.

17. The composition of claim 16, wherein the organic solvent is tetraethylene glycol dimethyl ether, sulfolane, or a combination thereof.

18. The composition of claim 16 comprising from 1 to 20 weight percent organic solvent based on total weight of the composition.

19. The composition of claim 1 further comprising a surfactant.

20. A method of etching a substrate having a surface comprising silicon nitride (SiN) and silicon oxide, with selectivity for etching the SiN relative to the silicon oxide, the method comprising:
    providing an etching composition comprising:
        concentrated phosphoric acid in an amount of at least 60 wt % based on the total weight of the etching composition,
        hexafluorosilicic acid (HSFA), and
        an amino alkoxy silane,
    providing a substrate having a surface that includes silicon nitride and silicon oxide, and
    contacting the substrate with the composition at conditions to remove SiN from the surface.

* * * * *